United States Patent [19]

Yariv et al.

[11] 4,212,020
[45] Jul. 8, 1980

[54] SOLID STATE ELECTRO-OPTICAL DEVICES ON A SEMI-INSULATING SUBSTRATE

[75] Inventors: Amnon Yariv, San-Marino; Shlomo Margalit; Chien-Ping Lee, both of Pasadena, all of Calif.

[73] Assignee: California Institute of Technology, Pasadena, Calif.

[21] Appl. No.: 926,649

[22] Filed: Jul. 21, 1978

[51] Int. Cl.² ............................................. H01L 33/00
[52] U.S. Cl. ........................................ 357/17; 357/18; 357/4; 357/41; 331/94.5 H
[58] Field of Search .................... 357/18, 17, 41, 4; 331/94.5 H

[56] References Cited

U.S. PATENT DOCUMENTS

| | | | |
|---|---|---|---|
| 3,309,553 | 4/1967 | Kroemer | 313/108 |
| 3,351,698 | 11/1967 | Marinace | 174/15 |
| 3,471,923 | 10/1969 | Lamorte | 29/572 |
| 3,982,207 | 9/1976 | Dingle | 331/94.5 H |
| 3,990,096 | 11/1976 | Naimizaki | 357/18 |

Primary Examiner—Martin H. Edlow
Attorney, Agent, or Firm—Freilich, Hornbaker, Wasserman, Rosen & Fernandez

[57] ABSTRACT

Solid state electro-optical devices are formed on a semi-insulating substrate, with all contacts of each device being on the same side of the substrate. These devices include two types of lasers, one operating on current crowding effect and the other by lateral diffusions. Either type laser is integratable with an electronic device e.g. a Gunn oscillator or an FET on the common semi-insulating substrate to form a complex monolithic electro-optical device.

11 Claims, 19 Drawing Figures

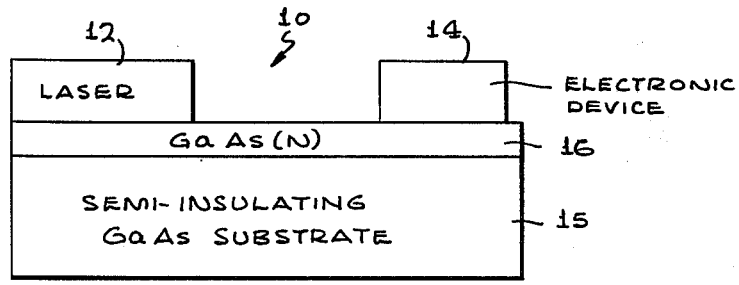
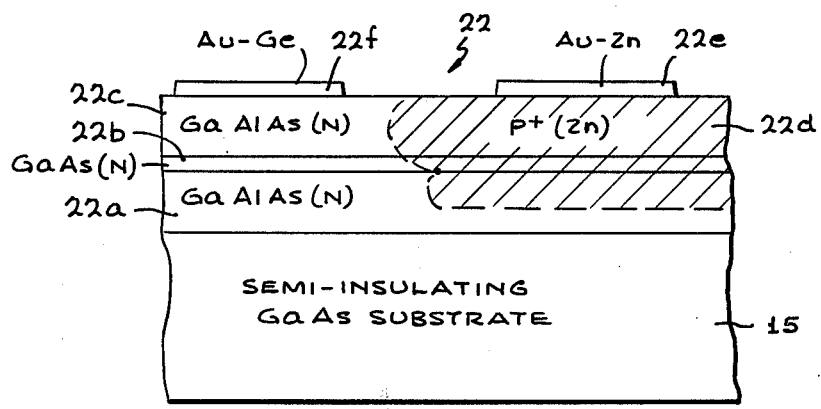
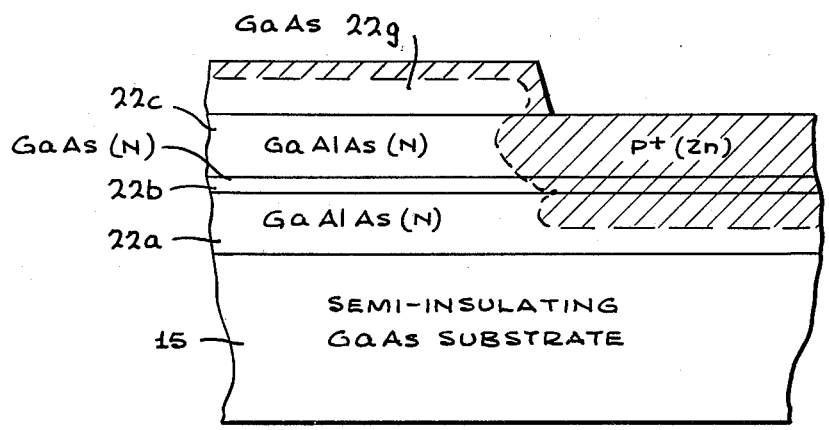

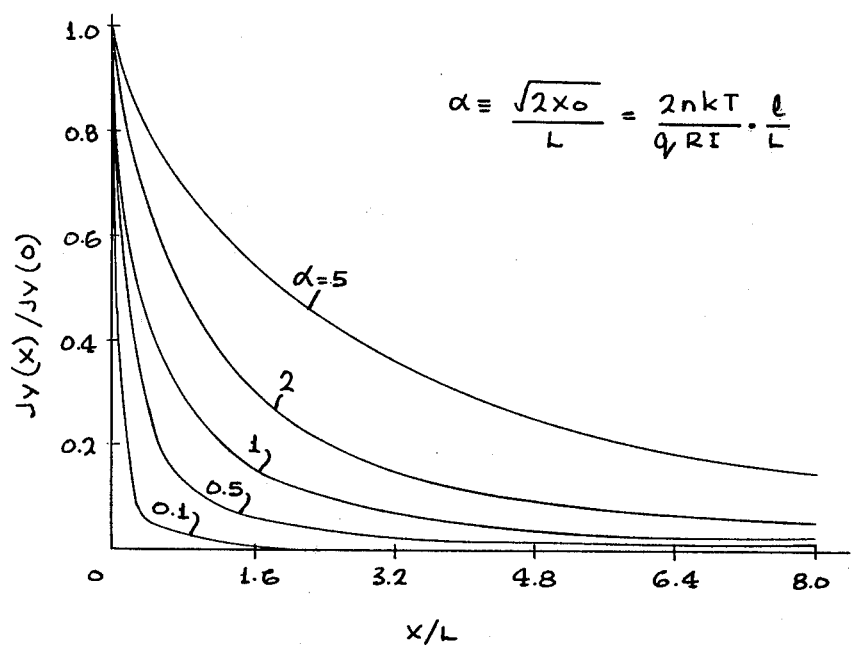
FIG. 9
FIG. 10
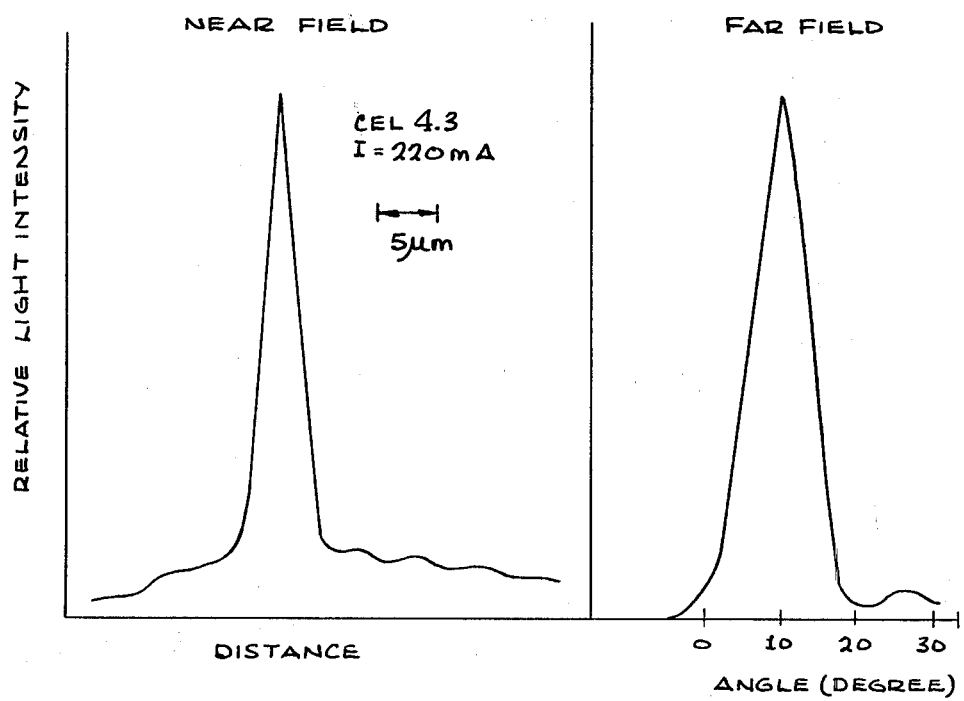

SOLID STATE ELECTRO-OPTICAL DEVICES ON A SEMI-INSULATING SUBSTRATE

ORIGIN OF THE INVENTION

The Government has rights in this invention pursuant to Contract No. N00014-74-C-0322 awarded by the Department of the Navy and pursuant to Grant No. ENG 76-04927 awarded by the National Science Foundation.

BACKGROUND OF THE INVENTION

1. Field of the Invention

The present invention generally relates to optical devices and, more particularly, to optical devices and to monolithic opto-electronic circuits on a semi-insulating substrate.

2. Description of the Prior Art

In recent years a significant amount of research has been directed to develop various devices, utilizing semiconductor materials. Among these devices are optical devices and electronic devices. With modern chip technology very thin layers of semiconductor materials can be grown or deposited on a substrate to produce very small devices. For example, with advances in GaAs device technology heterostructures of GaAs and GaAlAs have been developed to fabricate lasers. Also, due to the high electron mobility in N-type GaAs high speed GaAs electronic devices, such as Gunn oscillators and FET's have been produced. Since optical devices, such as a laser, and electronic devices can be used to form a complex optical circuit, it is highly desirable to be able to integrate all the devices to form a single chip, yet provide the electrical insulation of the devices from on another for proper circuit operation. To date, such complex monolithic integration has not been possible for the following basic reasons. All known GaAs type lasers are fabricated on a conductive GaAs substrate. Likewise, the substrate of known GaAs electronic devices is electrically conductive. Due to such electrical conduction the integration of such devices into a complex monolithic optical circuit i.e. one on a common substrate has not been possible, due to the need to electrically isolate the devices from one another.

OBJECTS AND SUMMARY OF THE INVENTION

It is a primary object of the present invention to provide a complex electro optical monolithic circuit.

Another object of the present invention is to provide a complex monolithic optical circuit in which a laser and an electronic device are fabricated on a common substrate, yet are electrically isolated from one another through the substrate.

A further object of the present invention is to provide new type lasers.

Yet, a further object of the invention is to provide a laser characterized by a new structure which lends itself to integrating the laser with an electronic device on a common substrate.

These and other objects of the invention are achieved by fabricating each of the devices, which are to be integrated on a semi-insulating substrate which is of GaAs, when the devices to be integrated are fabricated of GaAs. Since the invention will first be described in connection with GaAs type devices, the substrate will be referred to as the semi-insulating GaAs substrate, or simply the semi-insulating substrate. The term semi-insulating is assumed to mean semi-insulating electrical properties with a resistivity of not less than about $10^7$ ohm-cm. The integration of the various devices is achieved by fabricating them on the semi-insulating substrate in close proximity to one another to make the complex monolithic optical circuit as small as desirable or practical. Since, the substrate is semi-insulating it provides the required electrical insulation between the integrated devices. Various embodiments of the invention will be described hereafter.

Another object of the invention is achieved by providing a semiconductor heterostructure injection laser characterized by carrier crowding. A lateral diffusion laser with contacts on the same side of a semi-insulating substrate is also described.

BRIEF DESCRIPTION OF THE FIGURES

FIG. 1 is a simplified block diagram of a laser integrated with an electronic device on a semi-insulating substrate;

FIGS 2a and 2b are diagrams of one laser of the present invention;

FIGS. 3a, 3b, 4a, 4b, 5 and 6 are curves useful in describing the performance of the laser shown in FIG. 2a;

FIGS. 8–11 are curves useful in explaining the laser shown in FIG. 7;

DETAILED DESCRIPTION OF THE PREFERRED EMBODIMENTS

Figure 3A:
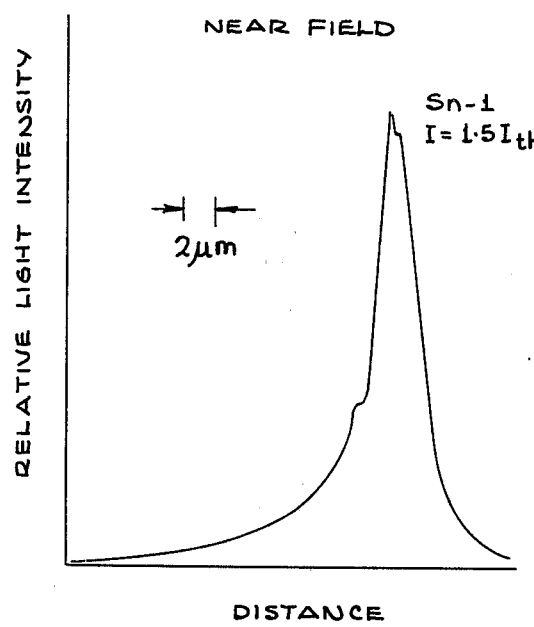

Attention is first directed to FIG. 1 which is a simplified diagram useful in explaining some aspects of the present invention in connection with GaAs type devices. In accordance with the present invention a complex monolithic optical circuit 10, shown consisting of a GaAs type laser 12 and a GaAs electronic device 14 are formed on a common semi-insulating GaAs substrate 15. Grown on the semi-insulating substrate is an active layer 16 of GaAs. This layer forms part of the electronic device 14 and may or may not be one of the layers of the laser, as will be explained herebelow. To provide circuit 10 with high speed operating characteristics layer 16 is of the N type, which is characterized by high electron mobility. In operation, any current flow between the electron device 14 and the laser 12 takes place in GaAs (N) layer 16, while the semi-insulating substrate 15 provides the necessary electrical insulation between the laser 12 and the electron device 14.

Before describing several embodiments of complex monolithic optical circuits on the semi-insulating GaAs substrate 15, two different types of lasers constructed on such a substrate will be described. Attention is directed to FIG. 2a which is a cross sectional view of a GaAs-GaAlAs injection laser 22 with a laterally diffused PN junction. The laser consists of a three-epilayer double heterostructure on the semi-insulating GaAs substrate 15. The three layers from the bottom are GaAlAs, GaAs and GaAlAs of the N type and are designated by 22a, 22b and 22c, respectively. The P type region designated by 22d is obtained by selective Zn diffusion into the three layers. A P type contact 22e e.g. Au-Zn, is formed on the top surface of the P type region 22d, while an N type contact 22f e.g. Au-Ge, is formed on the surface of the non-diffused portion of the GaAlAs top layer 22c.

Current flows laterally across the PN junction in the GaAs layer 22b from the P type contact 22e to the N type contact 22f. Since GaAlAs has a wider bandgap than that of GaAs, carriers are injected predominantly across the GaAs PN junction in the GaAs layer 22b. The effective area of the current injection is determined by the thickness of the GaAs layer 22b. Very thin GaAs layers can be obtained by liquid phase epitaxy (LPE). Thus, low threshold can be and was achieved, with the laser of the present invention.

It is recognized that the technique of tranverse injection is not new. It is described in an article entitled "Tranverse-Junction-Stripe Geometry Double Heterostructure Lasers with very Low Threshold Current" by Namizaki et al. J. Appl. Phys., vol. 45, pp. 2785-2786, June 1974. Another prior art article is entitled "Tranverse-Junction-Stripe Lasers with a GaAs p-n Hemojunction" by H. Namizake, IEEE J. Quantum Electron, Q E-11, vol. 7 (1975). The prior art structures suffer from current leakage through the P GaAlAs-N junction due to the highly conductive substrate. Recently, such current leakage problems are claimed to have been eliminated by the structures described in "New Structures of GaAlAs Later-Injection Laser for Low-Threshold and Single-Mode Operation" by Susaki et al. IEEE J. Quantum Electronics vol. Q E-13, No. 8, pp. 587-591, August 1977.

The structures described in the latter article also include a conductive substrate and each structure consists of five epilayers. In the laser 22, shown in FIG. 2a, only three layers are included and the current leakage is eliminated because the substrate 15 is semi-insulating. Thus, the laser on such a substrate is clearly more advantageous. It should also be pointed out that in the prior art laser structures, the two contacts are on opposite sides of the laser, one contact extending from the substrate. In the present invention both contacts are on the same side of the substrate, and therefore simplify the connection of the laser to other devices.

In one embodiment which was actually reduced to practice the laser 22 was fabricated by LPE growth and selective Zn diffusion. The $Ga_{1-x}Al_xAs$, GaAs, $Ga_{1-x}Al_xAs$ layers 22a–22c were grown successively to thickness of 3, 0.03 and 2 $\mu m$ respectively, with X~0.45. These three layers, all of the N type, form the laser's double heterostructure in the vertical direction.

As shown in FIG. 2b a top layer of GaAs, designated 22g was grown on layer 22c. It was used as a diffusion mask. It was found that Zn diffusion rate in GaAs is much slower than in $Ga_{1-x}Al_xAs$ and the higher the Al content the faster the diffusion. By using GaAs layer 22g as the diffusion mask an extra step of depositing an ordinary mask such a $SiO_2$ (doped with P) and $Si_3N_4$ was eliminated. Because GaAs and GaAlAs are almost perfectly lattice matched, the GaAs mask layer 22g is more stable than the ordinary masks. The stress which exists at the interface between the ordinary mask and the semiconductor usually causes problems such as crystal surface damage, unstable mask at high temperatures, and lateral diffusion under the mask. By forming the GaAs mask layer 22g, these problems are eliminated. Thereafter, part of the top GaAs layer 22g was etched away, with the remaining portion being shown in FIG. 2b. Then the structure was sealed in an evacuated quartz tube with $ZnAs_2$. The Zn diffusion took place at 660° C. for one hour. After the diffusion the GaAs mask layer 22g was etched away with an appropriate etching solution, e.g. $H_2O_2 + NH_4OH$ (pH=7.05). Thus, the structure after the last etching step was similar to that shown in FIG. 2a, except for the contacts 22d and 22e. The structure was then heat treated, at about 860° C. for 1.5 hours. Following heat treatment, the metal contacts 22d and 22e were formed.

A scanning electron micrograph of the final structure revealed that the slope of the diffusion front region front is not uniform. The greater slope in the GaAs layer 22b indicates that the diffusion in GaAs is slower than that in GaAlAs. The PN junction in the GaAs layer 22b is not perpendicular, but rather is tilted. That is, the width of the PN junction is greater than the thickness of layer 22b. Thus, laser 22 can be viewed as one being a combination of a heterostructure and a homostructure. It should however be appreciated that the shape of the junction may be varied by controlling the diffusion.

Figure 3B:
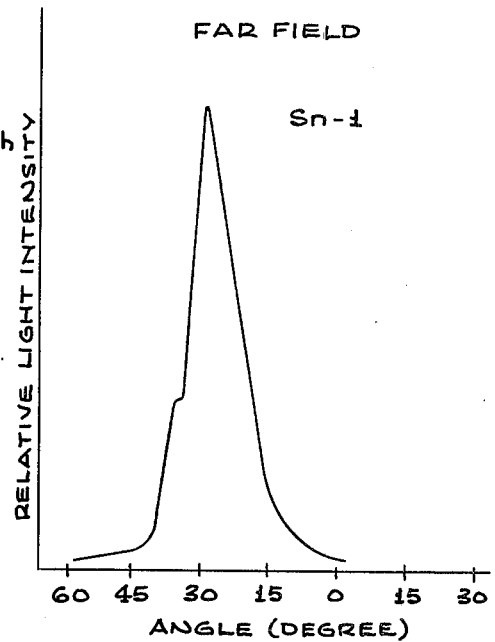

The lasing characteristics of the laterally diffused junction laser 22 depend strongly on the doping concentration of the N GaAs layer 22b. FIGS. 3a and 3b respectively show the near field and the far field of the laser when the doping concentration is low ($\sim 10^{17} cm^{-3}$, Sn doped). The near field has a small tail penetrating into the N side. The far field shows that the light is not emitted normal to the mirror surface, but at 30° to the N side. This feature can be explained qualitatively as follows. When the doping concentration of the N GaAs region is much lower than the Zn diffused P GaAs region, most of the recombination is due to the hole injection. The gain profile in the N GaAs region is determined by the carrier distribution in that region. Because the number of holes injected into the N side decays exponetially with distance, the gain also decays with the distance into the N side.

The laser light generated in the active region is guided along the cavity by a gain profile which decays to one side. Very little light is present on the other side because there is very strong absorption in the P type region. The solution of the wave equation in such a medium shows that the guided modes have wavefronts pointing toward one side, which is the N side for the case of the laterally diffused junction laser. Consequently, as the laser light exits from the mirror surface, it propagates to the N side.

Figure 4A:
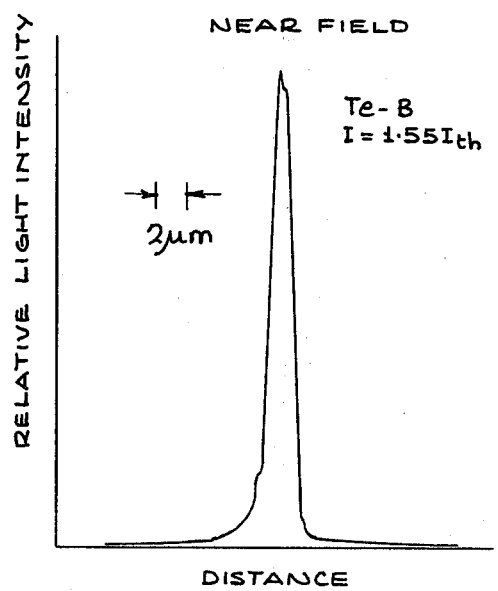
Figure 4B:
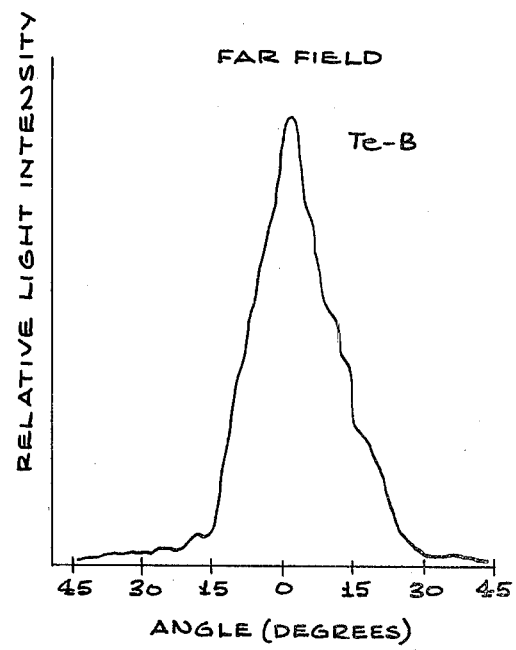

When the N type doping concentration of the GaAs layer is increased, the near field becomes narrower and the peak of the far field moves toward the center. FIGS. 4a and 4b respectively show the near field and the far field of the laser 22 with highly doped GaAs layer ($\sim 7 \times 10^{18}$ cm$^{-3}$, Te doped). The near field is very narrow with half width less than 2 $\mu m$. The far field is symmetric and is centered at $\theta = 0°$ (i.e., is emitted at a right angle to the surface). The laser has single transverse mode and stays stable as the current increases. The difference in the mode characteristics between lasers with low N doping and high N doping can be explained qualitatively as due to the fact that at some sufficiently high N doping the increase electron injection into the P type region causes the gain-loss profile to become symmetric about the junction plane and, furthermore, the compensated PN junction region has lower doping concentration hence higher index of refraction than those of the regions away from the junction.

Figure 5:
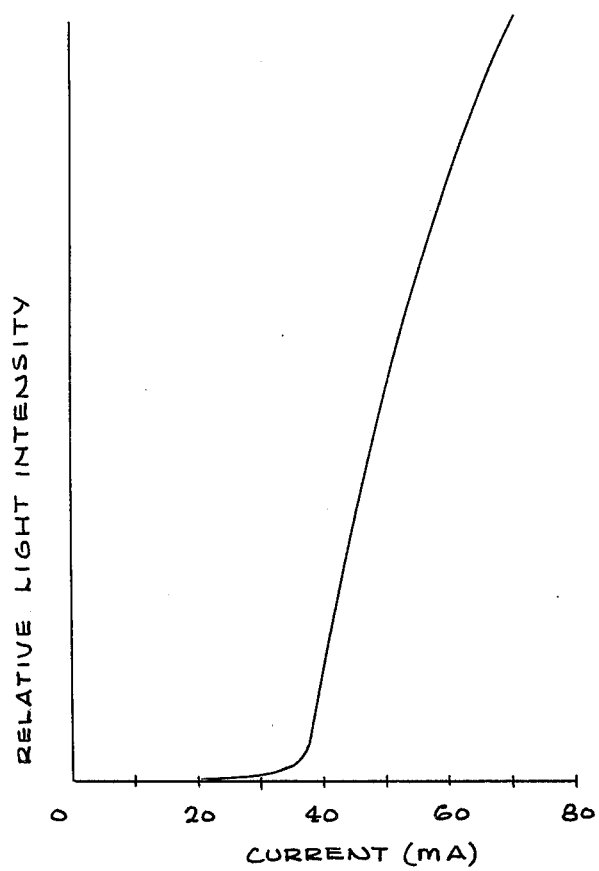
Figure 6:
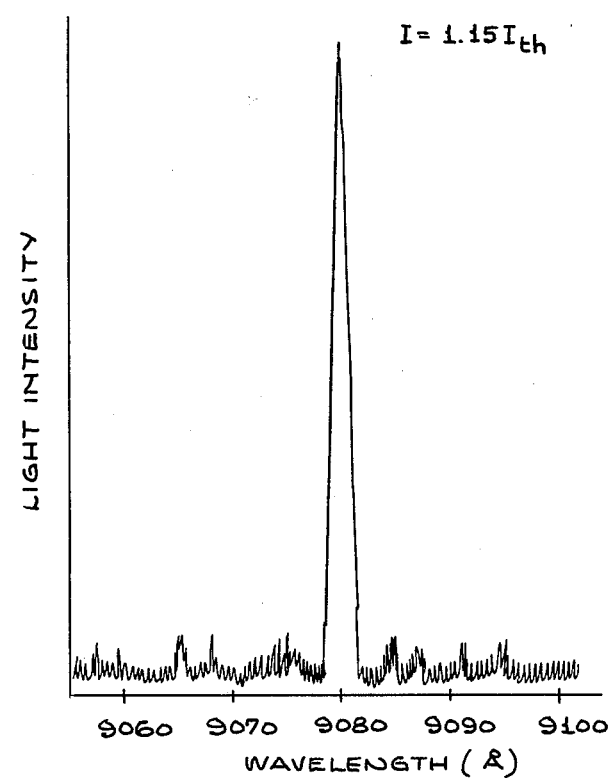

The N type dopants used for the GaAs layer 22b is Sn for low doping and Te for high doping. The lasers with the lowest threshold currents have doping concentration of about $4 \times 10^{18}$ cm$^{-3}$ (Sn doped). FIG. 5 shows the measured light intensity, curve of one laser as a function of the driving current. In one embodiment the laser cavity was 300 μm long and the threshold was 36 mA. No kinks were observed as the current was increased up to two times the threshold value. The spectrum of the lasing light was found to change with the N type doping concentration in the GaAs layer 22b. A number of Fabry-Perot longitudinal modes were seen when the doping concentration was low. At concentrations exceeding $\sim 5 \times 10^{18}$cm$^{-3}$ (obtained by Te doping) a single longitudinal mode was observed which is typical of such a laser. FIG. 6 is the spectrum of one of these lasers. The oscillating wavelength is longer than that of lasers with lower doping concentration, which might be due to the band tailing at high concentration.

Figure 7:
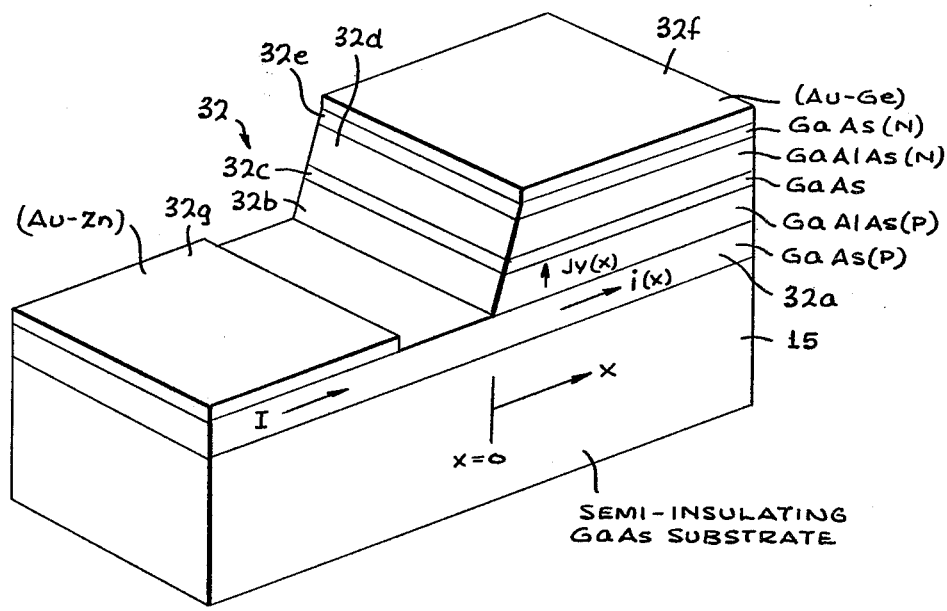
FIG. 7 is an isometric view of a novel current crowding laser of the present invention.

Attention is now directed to FIG. 7 which a three dimensional view of another type of a laser 32, fabricated on the semi-insulating GaAs substrate 15. It consists of five expitaxial layers 32a–32e, which are successively grown on the substrate 15. The five layers are respectively GaAlAs of the P type, GaAs which is not intentionally GaAs of the P type, GaAlAs of the N type and GaAs of the N type. In one particular embodiment the thickness of layer 32c is about 0.3 μm and those of the confirming layers 32b and 32d of Ga$_{1-X}$Al$_X$As where (X~0.4) are 2 μm.

After growing the five layers, an N type metal contact 32f e.g. Au-Ge is evaporated on layer 32e. Then a part of this metal layer 32f is removed photolithographically. The Au-Ge (as shown in FIG. 7) is used as a mask for the selective etching of epilayers 32b–32e. The etching is stopped at the first layer 32a to form a step-like structure (as shown) with edge parallel to the <110> direction. A P-type contact 32g e.g. Au-Zn is then evaporated on layer 32a. Using the step edge of layers 32b–32f as a self-aligned mask and evaporating the metal Au-Zn at an angle with respect to the structure, it is possible to separate the P-type and N-type contacts 32f and 32g by a small (~2 μm) distance. The crystal structure may then be cleaved to form several lasers of desired lengths e.g. 300 μm. Each laser is preferably mounted on an appropriate heat sink with the leads from both contacts 32f and 32g pointing up.

The laser 32 operates due to current crowding. The current crowding effect may be explained as follows. Regarding the edge of the step structure or mesa as X=0, when current I flows from the P contact 32g, as it enters the mesa region it splits into two components. Part of it, i(x), flows forward along the first two layers 32a and 32b. Part of it flows upward and across the junction with current density j$_Y$(x). Because of the sheet resisitance R of the first two layers the voltage becomes smaller as x increases. The decreasing rate of the voltage is proportional to the current i(x), i.e., $$\frac{dV(x)}{dx} = -\frac{R}{l} i(x) \tag{1}$$

where R is the sheet resistance of the first two layers and l is the length of the cavity. The derivative of i(x) is proportional to the current which flows across the junction. Therefore, $$\frac{di(x)}{dx} = -l j_y(x) \tag{2}$$

Taking v=0 at x=0, the junction equation is written as $$j_y(x) = j_y(0)\, e^{qv(x)/nkT} \tag{3}$$

where n is an integer which is 2 near the laser threshold. Substituting eq. (2) and eq. (3) into eq. (1) one gets $$\frac{d^2 v(x)}{dx^2} = R j_y(0) e^{qv(x)/nkT} \tag{4}$$

The solution of this equation is $$v(x) = \frac{nkT}{q} \ln \frac{2}{(\frac{x}{x_o} + \sqrt{2})^2} \tag{5}$$

$$\text{where } x_o = \left(\frac{nkT}{R j_y(0) q}\right)^{\frac{1}{2}} \tag{6}$$

Substituting eq. (5) into eq. (3) and eq. (1) one gets $$j_y(x) = \frac{2 j_y(0)}{(\frac{x}{x_o} + \sqrt{2})^2} \tag{7}$$

$$i(x) = \frac{2 l n k T}{q R x_o} \frac{1}{\frac{x}{x_o} + \sqrt{2}} \tag{8}$$

Using the condition i(0)=I one gets from eq. (8)

$$x_o = \frac{\sqrt{2}\, l n k T}{q R I} \tag{9}$$

and $$i(x) = \frac{\sqrt{2}\, I}{\frac{x}{x_o} + \sqrt{2}} \tag{10}$$

Taking the diffusion length L of the carriers as a characteristic length, one can rewrite eq. (7) and eq. (10) as $$j_y(x) = \frac{j_y(0)}{(\frac{x}{L} \frac{1}{\alpha} + 1)^2} \tag{11}$$

$$i(x) = \frac{I}{\frac{x}{L} \frac{1}{\alpha} + 1} \tag{12}$$

where $$\alpha = \frac{\sqrt{2}\, x_o}{L} = \frac{2\, n k T l}{q R I L} \tag{13}$$

Figure 8:
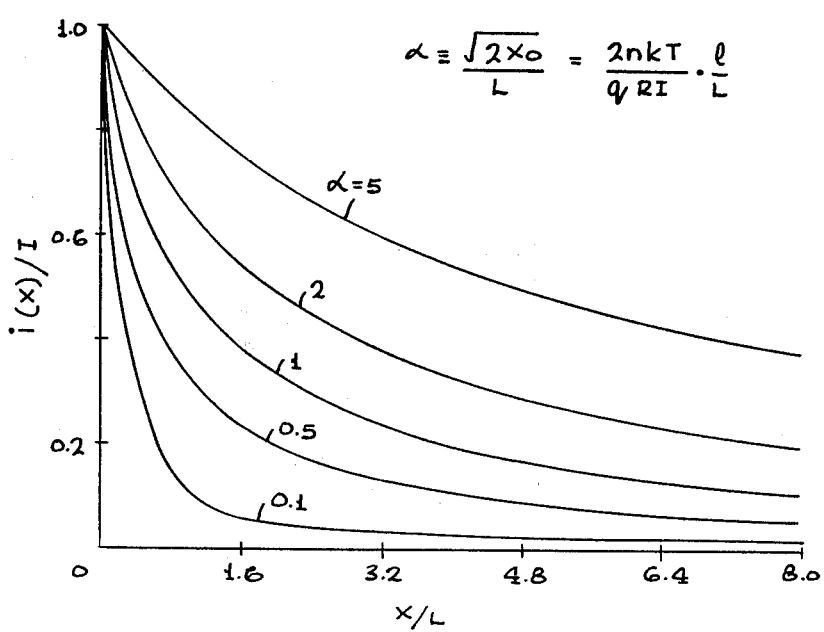

Using α as a parameter i(x) and j$_Y$(x) are plotted in FIGS. 8 and 9 respectively. When α is small or RI is large, the current is crowded more effectively to the vicinity of the edge of the step. When α is large or RI is small, the currents spread out further. This current crowding yields a narrow effective gain region near the mesa edge when the diode is driven above lasing threshold.

Figure 11:
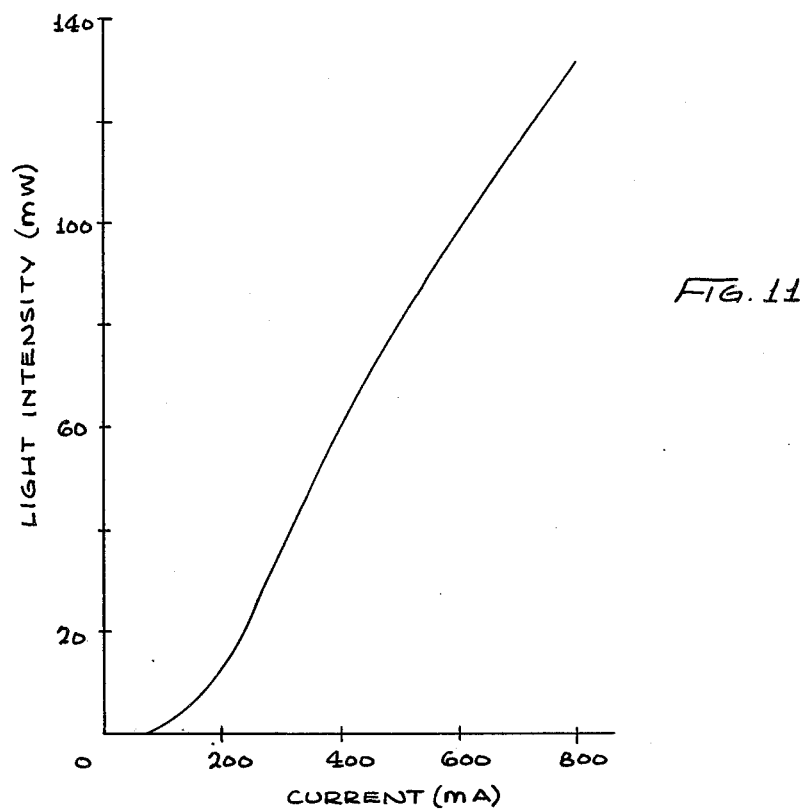

Photographs of the near field pattern of the laser 32 at different currents were taken. The picture give direct evidence of the crowding effect. With a current 10 mA, way below threshold, indicates a light distribution extending a long distance (~100 μm) under the mesa. With current above threshold, a much narrower light distribution occurs. Recorded traces of the near field and the far field of the laser are shown in FIG. 10. The half width of the near field is about 5 μm. The far field differs from the ordinary far field of a stripe geometry laser by having the peak of the light 10° off to the mesa side with respect to the normal direction of the mirror surface. A single transverse mode is usually observed when $I \leq 2Ith$. Higher order modes appear when the current is higher. FIG. 11 is a plot of the light intensity as a function of the driving current. High power operation with linear (no "kink") light current characteristics is usually achieved. Typical threshold current of a 300μm long laser is about 150 mA. Differential quantum efficiency is typically more than 30%.

Figure 12:
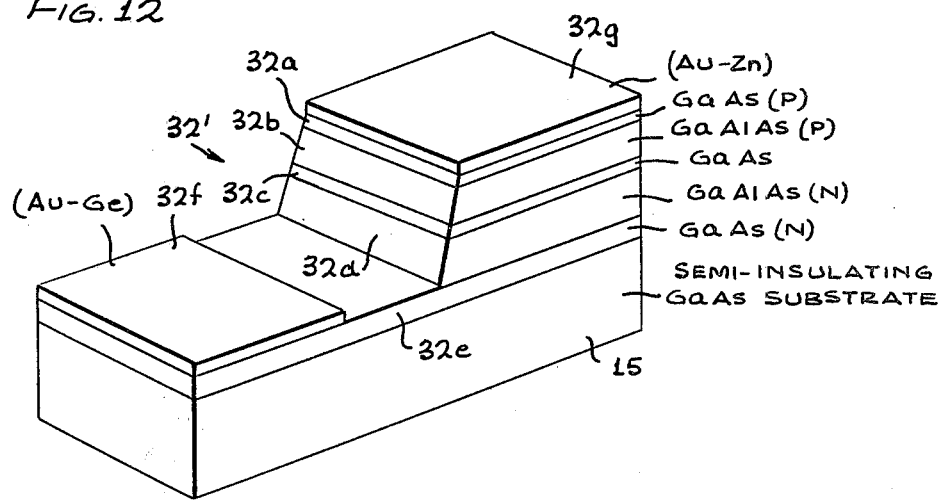
FIG. 12 is an isometric view of a different embodiment of the laser shown in FIG. 7.

Although in FIG. 7 the layers 32a and 32b are shown as being of the P type and layers 32d and 32e are shown as being of the N type, the types of these layers may be reversed and the locations of the N type contact 32f and the P type contact 32g reversed as well, as shown in FIG. 12, wherein the laser is designated by 32'. It should thus be clear that in laser 32' the layer 32e which is the first to be grown on the substrate 15 is of GaAs of the N type. Both lasers 32 and 32' have similar properties and characteristics. However, laser 32', due to its GaAs (N) layer 32e being on top of the substrate has an additional, very significant advantage. As previously pointed out, GaAs of the N type is characterized by high electron mobility. It is for this reason that many electron devices such as Gunn oscillators and FET's are fabricated from GaAs of the N type. Since in laser 32' the bottom layer 32e is of such material the laser can be easily integrated with any GaAs N type device into a complex monolithic optical device. For the integration purposes the GaAs N type layer 32e of laser 32' can serve as both the bottom layer of the laser 32' and the electronic device to be integrated therewith.

Figure 13:
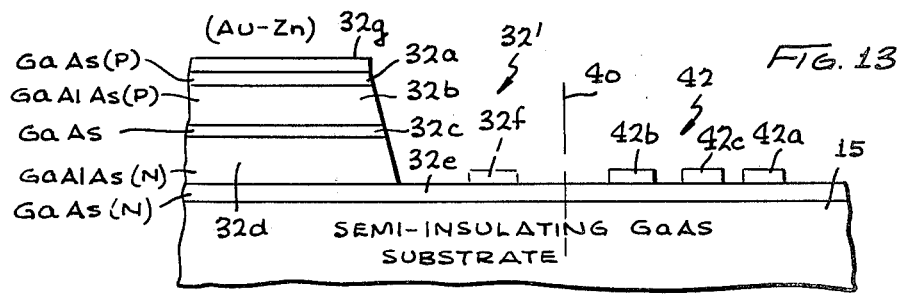
FIG. 13 is a diagram of a current crowding laser integrated with a Gunn device on a semi-insulating substrate.

One such integrated arrangement is shown in FIG. 13. The structure to the left of dashed line 40 represents laser 32', while the structure to the right of line 40 represents a Gunn device or oscillator 42. Such a device typically consists of two contacts 42a and 42b on top of a GaAs N type layer. As is known, in such a device when the voltage across its contacts such as 42a and 42b exceeds a selected level the current therebetween oscillates. In FIG. 13 the N type contact 32f of the laser 32' is shown by dashed lines. This contact is not necessary when the laser and the Gunn device are integrated, to form the monolithic complex circuit, since one of the contacts of the Gunn device serves as the laser's N type contact.

In accordance with the present invention the Gunn device contact 42a, which also serves as the N type contact of the laser. When a voltage is applied between contacts 32g and 42a, a voltage drop is present between contacts 42a and 42b. When this voltage drop is sufficiently high an oscillating current flow is produced. This oscillating current flows through the laser and therefore the laser light beam may be made to oscillate. If the range of the current oscillation is higher than the laser threshold current, the laser light modulates i.e. varies in intensity. On the other hand, if the threshold current lies in the range of the current oscillation the laser light is turned on and off repeatedly. As is known the frequency of oscillation depends on the distance between electrodes of the Gunn device and is higher when the distance is smaller. With an embodiment actually reduced to practice modulation has been achieved. It should be pointed out that in practice contacts 42b and 42a should be located close to the mesa, approximately where contact 32f is shown. It is believed that if contact 42a can be placed sufficiently close to the mesa, contact 42b, to which no potential is applied may be eliminated.

The integration arrangement, shown in FIG. 13, is not intended to be limited to one in which a laser is integrated with a Gunn oscillator. Other electronic devices may be integrated with the laser on the common semi-insulating GaAs substrate. For example a Schottky gate FET may be integrated. In such a case contact 42a (FIG. 13) may be one of the electrodes, contact 42b may be used as the gate electrode and the P type contact 32g on top of the laser, as the third electrode. The FET may be used to modulate the current which drives the laser and thereby modulates light. Since the FET and the laser are integrated on the common substrate i.e. made as the same chip very high speed operation is possible. It should be pointed out that a third FET contact 42c may be added to provide biasing capabilities. It is apparent that in the FET contacts 42b and 42c are ohmic contacts and contact 42a is the Schottky contact.

Figure 14:
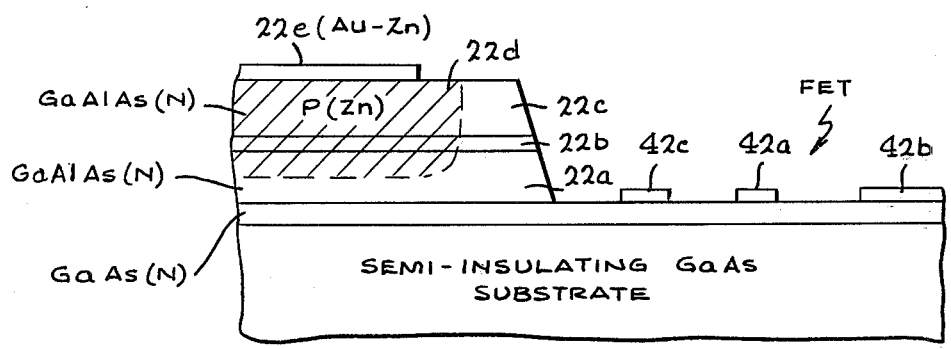
FIG. 14 is a diagram of a lateral diffusion type laser integrated with an FET on a semi-insulating substrate.

In FIG. 13 the current crowding effect laser is shown integrated with an electronic device. Clearly, the invention is not intended to be limited to such a laser only. If desired the lateral diffusion laser 22, which was described in connection with FIG. 2a, may be integrated with the electronic device. Such an arrangement is shown in FIG. 14, wherein like numerals are used to designate like elements. It should be pointed out that in the integrated arrangement, shown in FIG. 13, the N type GaAs layer 32e forms part of the laser 32' and is also the active layer of the electronic device 42. In the lateral diffused laser 22 the bottom layer 22a is of GaAlAs. Thus, to provide the integration the layer 16 of N type GaAs is first grown on the substrate 15. Only then is the laser 22 formed thereon. Layer 16 has excellent lattice matching parameters with the GaAlAs layer 22a of laser 22. The integrated arrangement of FIG. 14 has the same advantages as those heretofore described in connection with FIG. 13.

Figure 15:
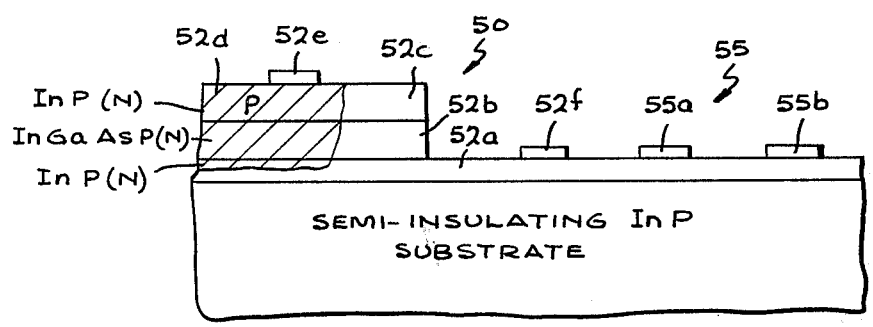
FIGS. 15 and 16 are diagrams of different lasers integrated with electronic devices.

Although heretofore the various aspects of the invention have been described in connection with GaAs-GaAlAs type devices on a semi-insulating GaAs substrate, the invention is not intended to be limited thereto. Other appropriate materials may be used to form the separate lasers and or the integrated arrangements on a semi-insulating substrate, formed of other than GaAs. FIG. 15 is a diagram of a lateral diffused type laser 50 formed on InP semi-insulating substrate 52. The laser consists of layers 52a, 52b, and 52c of InP. In GaAsP and InP all of the N type with a P diffused region 52d and P and N contacts 52e and 52f. The laser may be integrated with an electronic device 55 with contacts 55a and 55b above active layer is the InP N type layer 52a.

Figure 16:
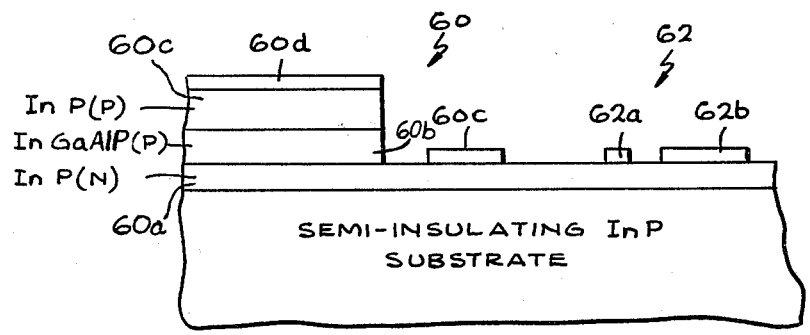

FIG. 16 shows a similar arrangement in which the laser 60 is of the crowding effect. It consists of layers 60a, 60b and 60c of InP type N, InGaAlP and InP of the P type and P and N type contacts 60d and 60e. The electronic device is designated by 62 and shown having contacts 62a and 62b. If the laser 60 is not to be integrated the types of layers 60a and 60c may be reversed.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An arrangement comprising:
    a GaAs semi-insulating layer, representing a substrate with a top surface,
    a solid state laser structure on top of said substrate, said laser structure comprising first, second, third, fourth and fifth layers of GaAs N type, a ternary compound of GaAs of the N type, GaAs, a ternary compound of GaAs P type and GaAs P type, respectively, above said substrate, with said first layer extending beyond the other layers which form a mesa;
    a first contact on top of said fifth layer,
    a second contact on the top surface of said first layer, spaced apart from the other layers which form said mesa, and
    electronic means wherein the first GaAs N type layer forms part thereof,
    said electronic means including an additional contact, with said second contact being adjacent said mesa and the additional contact being spaced therefrom in a direction farther away from said mesa, said electronic means being substantially a Gunn oscillator.

2. An arrangement comprising:
    a GaAs semi-insulating layer, representing a substrate with a top surface,
    a solid state laser structure on top of said substrate, said laser structure comprising first, second, third, fourth and fifth layers of GaAs N type, a ternary compound of GaAs of the N type, GaAs, a ternary compound of GaAs P type and GaAs P type, respectively, above said substrate, with said first layer extending beyond the other layers which form a mesa;
    a first contact on top of said fifth layer,
    a second contact on the top surface of said first layer, spaced apart from the other layers which form said mesa; and
    a field effect transistor, definable as FET, beyond said mesa with a Schottky type contact on said first layer, forming the gate electrode of said FET and said second contact being one of the ohmic contacts of said FET.

3. An arrangement as recited in claim 2 further including an additional ohmic contact between said mesa and said Schottky type contact.

4. An arrangement comprising:
    a substrate of semi-insulating matter with a resistivity of not less than about $10^7$ ohm-cm
    a solid state laser comprising n layers of semi-conductor materials on said substrate, n being an integer, the first of said layers being on said substrate and having lattice matching properties therewith, with the rest of said layers extending above said first layer, said layers being N doped type and including a P doped region, any two adjacent layers being respectively of a selective semi-conductor material and a ternary compound thereof;
    a first electrical contact on the top surface of the top layer on the P type region; and
    a second electrical contact on a portion of said first layer which extends beyond the other layers, wherein said second contact and the portion of the first layer of the N type which extends beyond the other layers form part of electronic means for controlling the current flow between said first and second contacts, said electronic means comprise a Gunn device.

5. An arrangement as recited in claim 4 wherein said Gunn device further includes an additional contact on said first layer between the other layers and said second contact.

6. An arrangement comprising:
    a substrate of semi-insulating matter with a resistivity of not less than about $10^7$ ohm-cm
    a solid state laser comprising n layers of semi-conductor materials on said substrate, n being an integer, the first of said layers being on said substrate and having lattice matching properties therewith, with the rest of said layers extending above said first layer, said layers being N doped type and including a P doped region, any two adjacent layers being respectively of a selective semiconductor material and a ternary compound thereof;
    a first electrical contact on the top surface of the top layer on the P type region; and
    a second electrical contact on a portion of said first layer which extends beyond the other layers, wherein said second contact and the portion of the first layer of the N type which extends beyond the other layers form part of electronic means for controlling the current flow between said first and second contacts, said electronic means comprises a field effect transistor, definable as an FET, and further includes a Schottky type contact on said first layer between said other layers and said second contact.

7. An arrangement as recited in claim 6 wherein said FET further includes an additional contact on said first layer between said other layers and said Schottky type contact.

8. In combination with a solid state laser comprising a stack of plurality of layers of semi-conductor materials on a semi-insulating substrate with a resistivity of not less than about $10^7$ ohm-cm, the first of said layers being N type and extending on said substrate beyond the other layers with a first electrical contact on the top layer and a second contact on the first layer, farther removed from the other layers, an arrangement comprising:
    at least one additional contact on said first layer which together with the portion of the first layer which extends beyond the other layers form part of an electronic means for controlling the current flow between said first and second contacts.

9. An arrangement as recited in claim 8 wherein said electronic means in a Gunn device.

10. An arrangement as recited in claim 8 wherein said electronic means comprises a field effect transistor, definable as an FET, with said at least one additional contact being a Schottky type contact between said other layers and said second contact.

11. An arrangement as recited in claim 10 wherein said FET includes an additional contact on said first layer between said other layers and said Schottky type contact.

* * * * *